United States Patent
Nelsen et al.

(10) Patent No.: US 6,310,557 B1
(45) Date of Patent: Oct. 30, 2001

(54) CIRCUIT AND DEVICE TO DETECT GROUNDING PROBLEMS IN ELECTRICAL SOLDERING IRONS

(75) Inventors: Lyle Nelsen; Steven B. Heymann, both of San Jose, CA (US)

(73) Assignee: NOVX Corporation, San Jose, CA (US)

( * ) Notice: Subject to any disclaimer, the term of this patent is extended or adjusted under 35 U.S.C. 154(b) by 0 days.

(21) Appl. No.: 09/270,972

(22) Filed: Mar. 17, 1999

(51) Int. Cl.[7] .................................................. G08B 21/00
(52) U.S. Cl. .......................... 340/649; 340/650; 340/464; 219/229; 219/497
(58) Field of Search .................... 340/649, 650, 340/464; 219/229, 497

(56) References Cited

U.S. PATENT DOCUMENTS

| | | | |
|---|---|---|---|
| 3,290,668 | * 12/1966 | Perretta | 340/255 |
| 4,859,992 | * 8/1989 | Hoigaard | 340/649 |
| 5,083,117 | * 1/1992 | Hoigaard | 340/649 |
| 5,463,379 | * 10/1995 | Campbell et al. | 340/657 |
| 5,519,384 | * 5/1996 | Chanudet et al. | 340/649 |

* cited by examiner

*Primary Examiner*—Daniel J. Wu
*Assistant Examiner*—Tai T. Nguyen
(74) *Attorney, Agent, or Firm*—The Kline Law Firm (57) ABSTRACT

A circuit and device to detect grounding problems in electrical soldering irons. The device includes a cleaning sponge in electrical connection with a sensor element. The sensor element is connected to the controlling circuitry which is in turn connected to a safety grounding point, such as a screw of a face plate of an electrical outlet. The circuitry includes LED's which indicate when the grounding mechanism is functional, and when the grounding connection is broken. Additional circuitry tests for a low impedance path to ground via a sensor element contacted by the soldering iron tip or (in the case of an isolated tip) the soldering iron heater barrel. Further circuits indicate when the cleaning sponge has gone dry, and when the operator has an unsafe level of electrostatic charge.

18 Claims, 9 Drawing Sheets

CIRCUIT AND DEVICE TO DETECT GROUNDING PROBLEMS IN ELECTRICAL SOLDERING IRONS

FIELD OF THE INVENTION

The present invention relates generally to electrical monitoring devices, and more particularly is a circuit and device to detect grounding problems in electrical soldering irons.

BACKGROUND OF THE INVENTION

Active and passive electronic components are known to be very sensitive to electrical overstress. It is therefore important for electrical soldering irons, which make frequent contact with such components, to be totally free of static and dynamic electrical potentials.

The tip and all externally exposed metal parts of a typical laboratory grade soldering iron are therefore grounded. The low ohmic grounding connection is usually made through the "green wire" of the Power Cord. However, repeated flexing of the Power Cord during soldering operations may cause the conductors In the Power Cord to break. A break in one or both of the heating current carrying conductors is immediately obvious because the soldering iron will no longer produce heat. A break in the "green grounding wire", however, is usually not readily noticed, and can thus exist for a long period of time.

When the grounding connection is no longer functional, electrical potentials of sufficient amplitude to cause latent or permanent damage may develop on the soldering iron tip. The potentials may be due either to the accumulation of Electrostatic Charge or to the coupling of alternating voltage potentials through parasitic capacitors between the heating element of the soldering iron and exposed metal on the soldering iron.

The circuit and device of the present invention allow for ongoing monitoring of the integrity of the grounding connection of the soldering Iron tip. The present invention exploits the fact that a soldering iron tip is frequently cleaned by wiping on a suitable leaning device.

The most widely used cleaning device is a moist sponge. A moist sponge usually is conductive because the water in it is highly contaminated with ionic compounds which naturally exist in the sponge and with deposits of ionic compounds that are typically found in soldering fluxes and which are deposited on the sponge during the wiping action. An electrical circuit can thus be established which comprises the soldering iron tip, the conductive sponge, and the safety ground.

Other cleaning devices use metallic sponges that are similar to steel wool but that are made out of a copper or bronze wire mesh. These sponges too are conductive, and thus can be made part of an electrical circuit as described above.

The cleaning device, whether natural or synthetic sponge or wire mesh, can be an integral part of a soldering station or it can be a stand-alone device.

Accordingly, it is an object of the present invention to provide a means to detect grounding problems in soldering irons that are in use.

It is a further object of the present invention to provide a method of monitoring the grounding connection that makes use of commonly used equipment.

It is a still further object of the present invention to provide a way to continuously monitor the grounding connection of the soldering iron.

SUMMARY OF THE INVENTION

The present invention is a circuit and device to detect grounding problems in electrical soldering irons. The device comprises a cleaning sponge in electrical connection with a sensing element. The sensing element is connected to the controlling circuitry and to a safety grounding point, such as a screw of a face plate of an electrical outlet. The circuitry includes LED's which indicate when the grounding mechanism of the soldering iron is functional, and when its grounding connection is broken. The controlling circuitry tests for a low ohmic path between the electrical safety ground and the metal parts of a soldering iron which may make contact with an electronic component. Further circuits indicate when the cleaning sponge has gone dry, and when the operator has an unsafe level of electrostatic charge.

An advantage of the present invention is that current soldering work stations can be easily retrofitted to include the device. The device can also be manufactured as a stand-alone item.

Another advantage of the present invention is that it continually monitors the grounding connection with no required action on the part of the operator.

These and other objects and advantages of the present invention will become apparent to those skilled in the art in view of the description of the best presently known mode of carrying out the invention as described herein and as illustrated in the drawings.

DETAILED DESCRIPTION OF THE INVENTION

Figure 1:
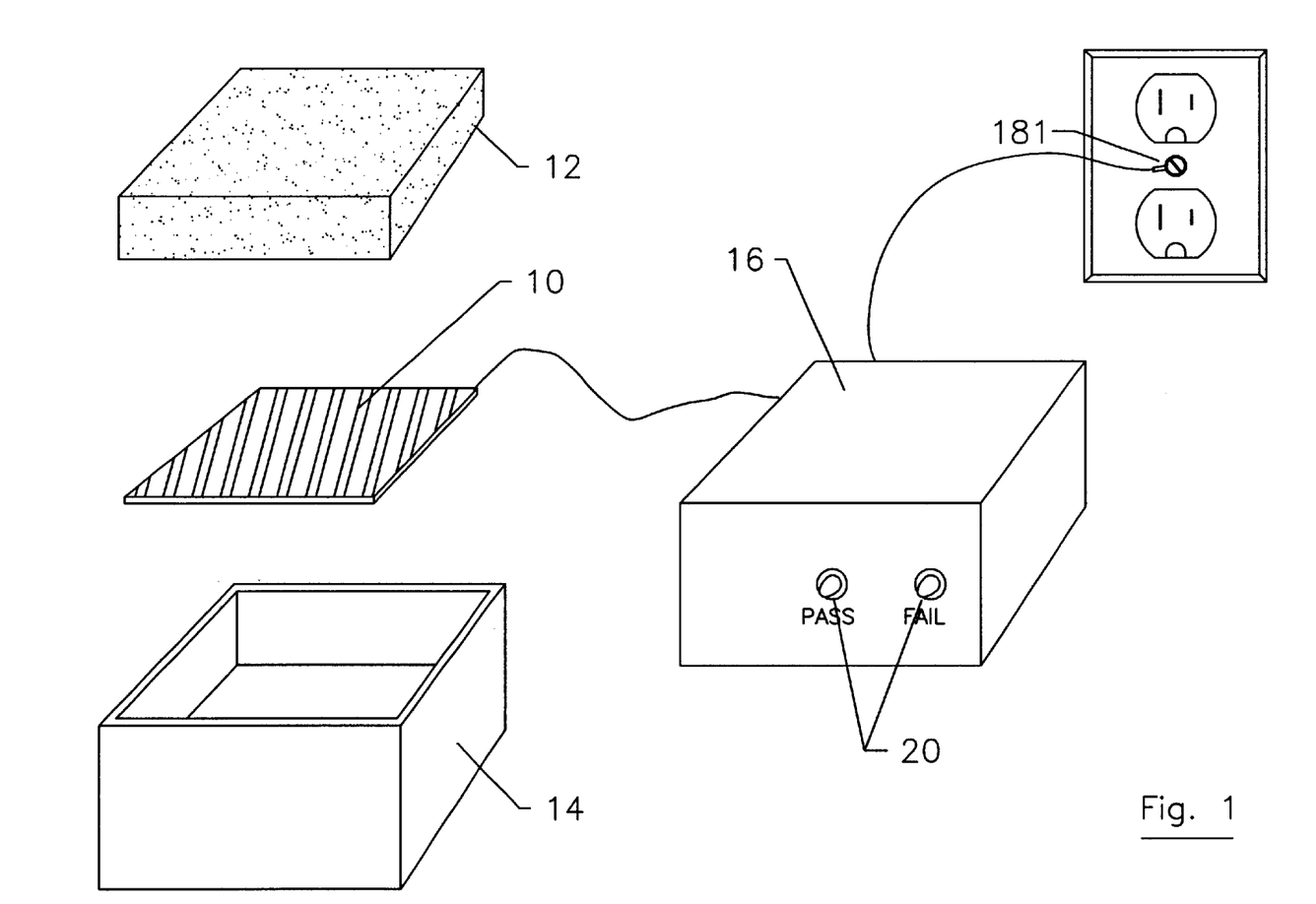
FIG. 1 is a perspective exploded view of the present invention installed in an existing soldering iron tip cleaning device.

The present invention is a circuit and device to detect grounding problems in electrical soldering irons. Referring first to FIG. 1, the present invention comprises at least one sensor element 10 placed in physical connection with a cleaning sponge 12. Typically, the sensor element 10 is placed in a sponge holder 14. The cleaning sponge 12 is then placed in the sponge holder 14 in contact with the sensor element 10.

The sensor element 10 is electrically connected to a control box 16 which contains the circuitry that operates the device. The control box also contains a power source for the device, typically batteries. (A detailed description of the circuitry of the present invention follows this description of the physical structure of the device.)

The circuitry in the control box 16 is in ohmic connection to a safety grounding infrastructure 18 of a facility in which the device is installed. The grounding point may be any element of the facility's grounding infrastructure 18. Where readily available, a screw 181 of a face plate of an electrical outlet can be utilized.

The control box 16 also includes indicator LED's 20 situated so that they are visible on the exterior of the control box 16. The indicator LED's 20 are controlled by the controlling circuitry of the device. The circuitry may contain at least four functional sections: (I) The basic soldering iron tip voltage test circuit, (II) a dry sponge sensing circuit, (III) Operator grounding integrity verification circuit, and (IV) a hard ground verification circuit.

Figure 2:
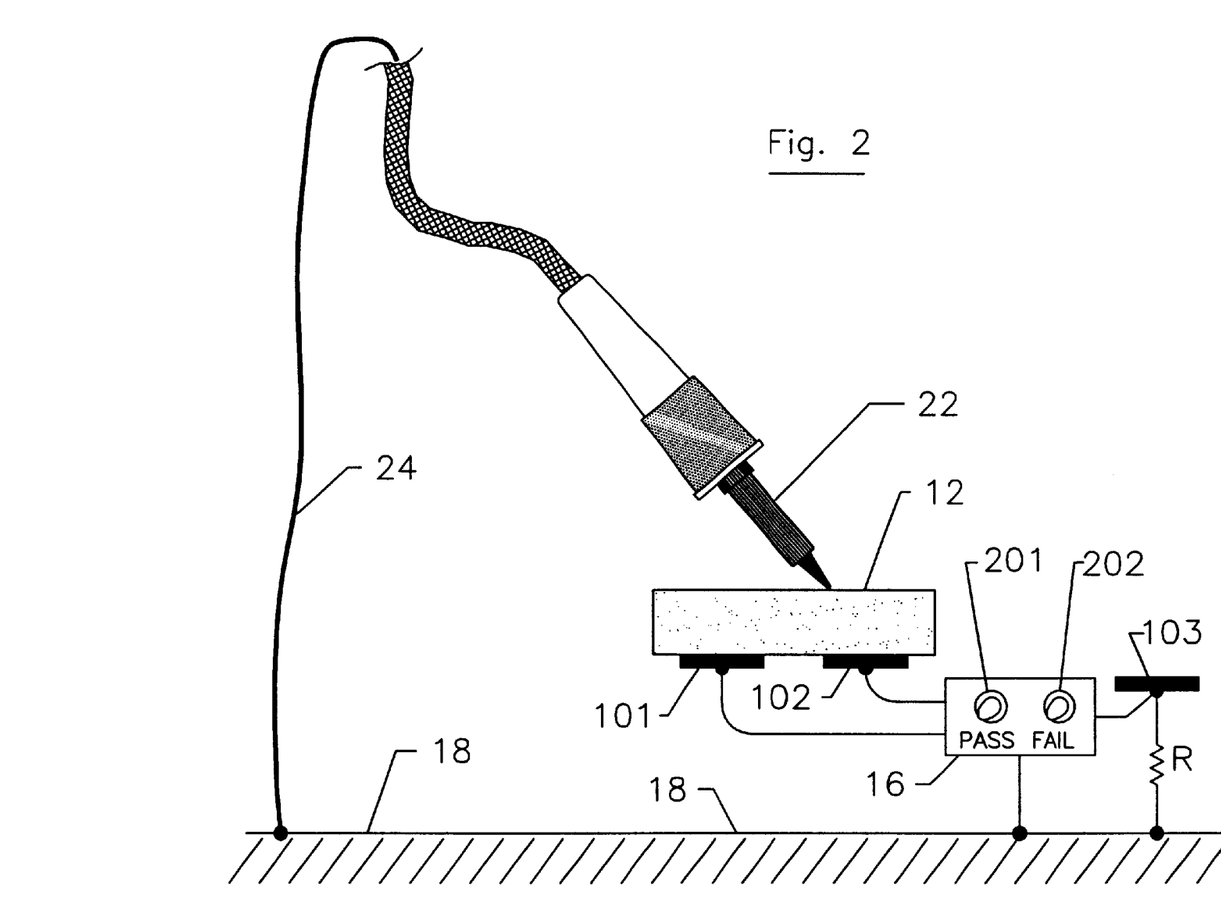
FIG. 2 is a side cutaway view and block diagram of the present invention.

(I) Soldering iron tip voltage test circuit: Referring now to FIG. 2, the soldering iron tip voltage test circuit accomplishes the chief function of the device, determining whether a soldering iron 22 is properly grounded. The circuit comprises the green grounding wire of an electrical cord 24 of the soldering iron 22. The green wire is of course connected to the grounding infrastructure 18 of the facility. The circuit is closed when the tip of the soldering iron 22 is pressed against the cleaning sponge 12, which is in contact with a first sensor plate 101. The first sensor plate 101 is connected to the controlling circuitry of the device which includes a contact to ground 18. Therefore, when the grounding mechanism for the soldering iron 22 is functioning properly, a first LED 201 is activated on the control box 16 upon the soldering iron 22 forming an electrical connection with the cleaning sponge 12.

If the soldering iron 22 is not properly grounded, a second LED 202 is activated when the iron tip is touched to the cleaning sponge 12. In addition, in the case wherein the soldering iron tip is not properly grounded, an audible alarm 26 (see FIG. 7) is also activated to ensure that the operator does not miss the visual cue of the second LED 202.

Figure 4:
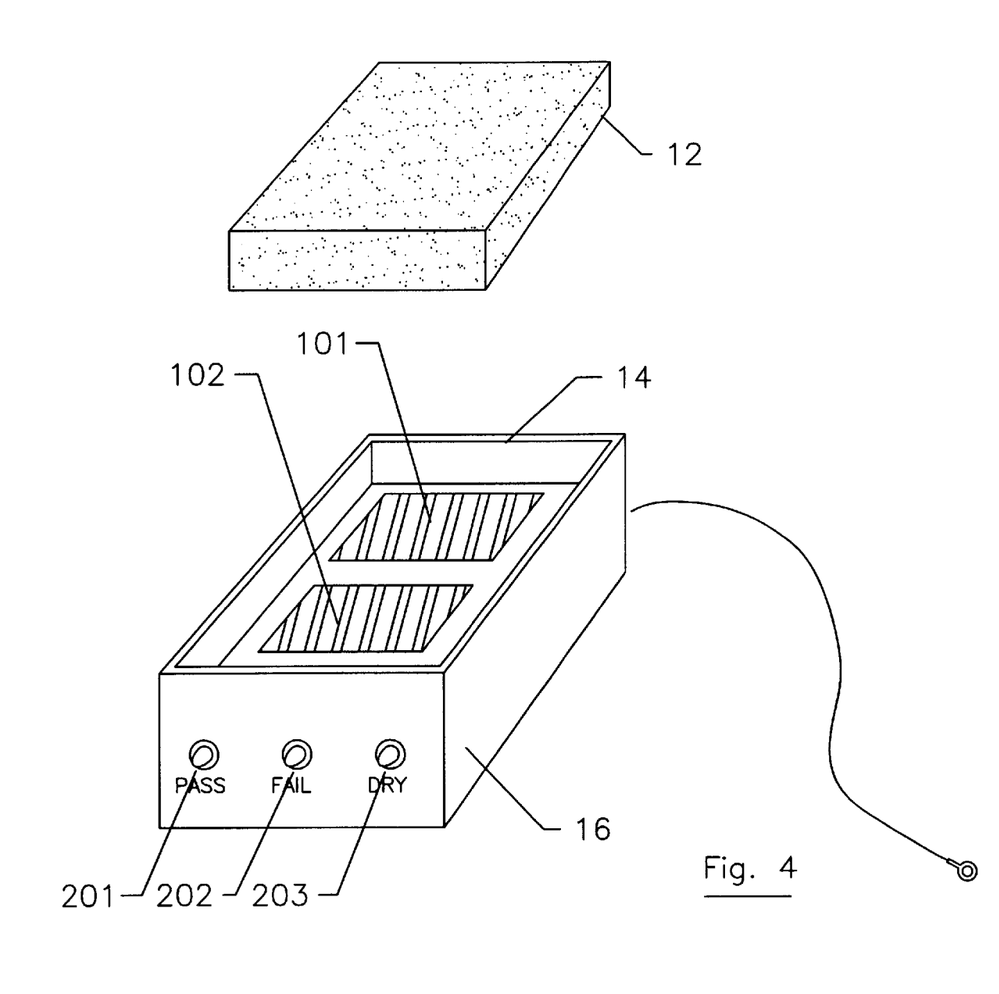
FIG. 4 is a perspective view of an alternate conformation of the stand-alone embodiment of the present invention.
Figure 9:
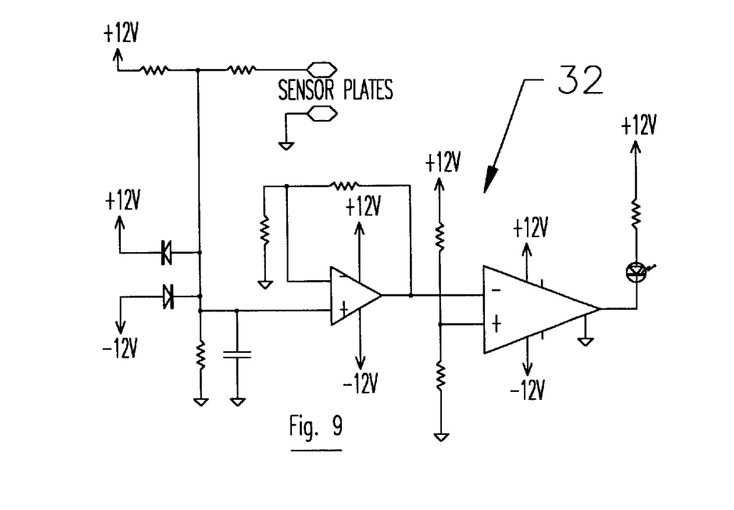
FIG. 9 shows the additional circuitry required to implement the dry sponge sensing circuit.

(II) Dry sponge sensing circuit: Referring now to FIGS. 2 and 4, a second sensor plate 102 and the circuitry 32 illustrated in FIG. 9 are added to the device. Together with sensor plate 101, the second sensor plate 102 and the additional circuitry 32 allow for detection of the moisture content of the cleaning sponge 12. If sufficient moisture for proper cleaning of the soldering iron tip exists, an ohmic path will exist between the first sensor plate 101 and the second sensor plate 102. When the sponge 12 is too dry, the sensor plates 101, 102 will be electrically isolated from each other. The electronic circuitry 32 allows detection of the value of the resistance of the ohmic path. If the value of the resistance is above a threshold level, LED 203 is activated, indicating that the sponge no longer contains sufficient moisture.

Figure 5:
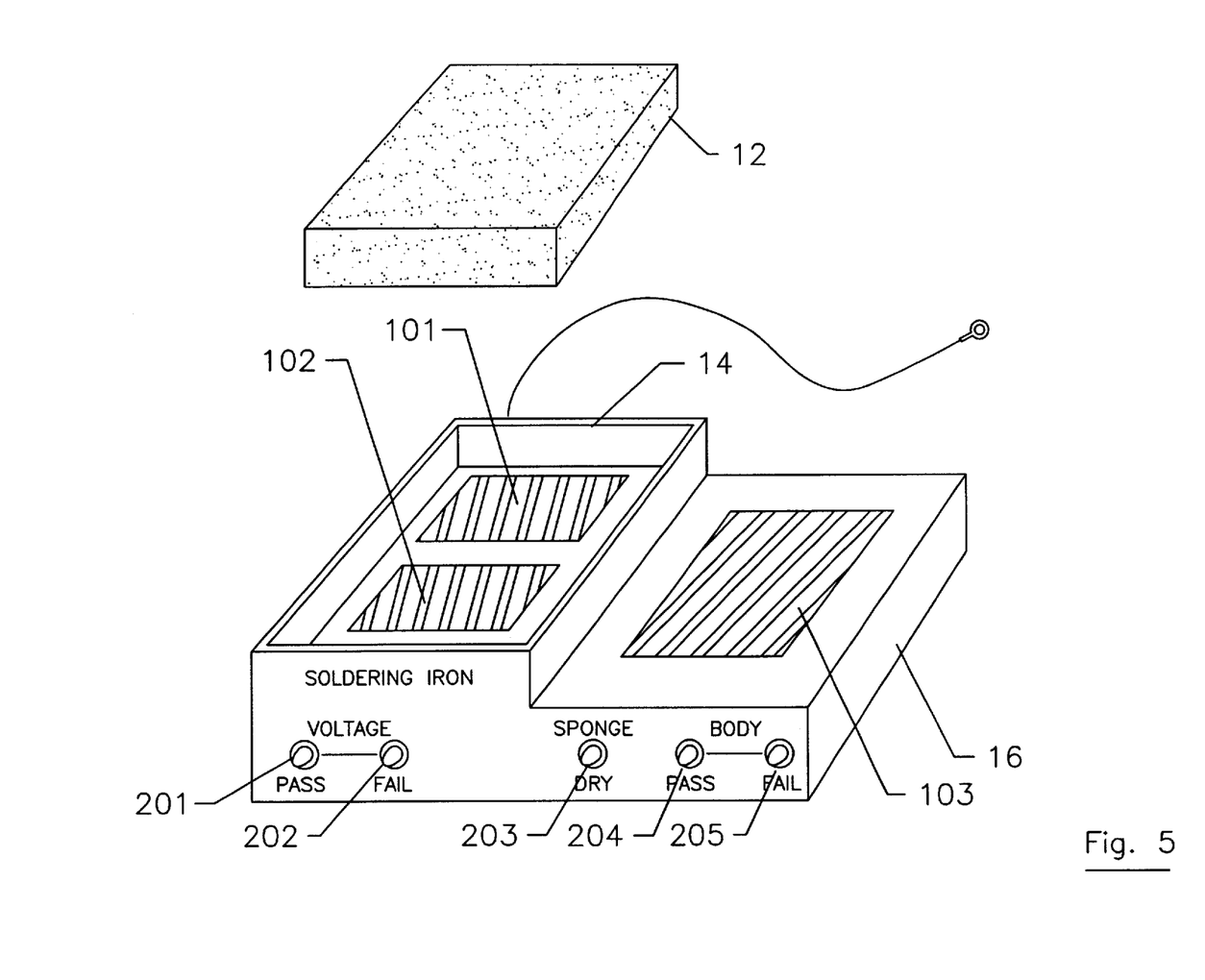
FIG. 5 is a perspective view of another alternate conformation of the stand-alone embodiment of the present invention.
Figure 10:
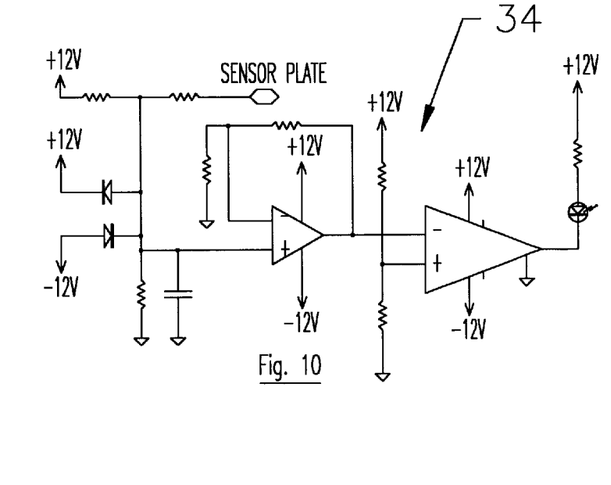
FIG. 10 illustrates the additional circuitry required to implement the operator grounding integrity verification circuit.
Figure 11:
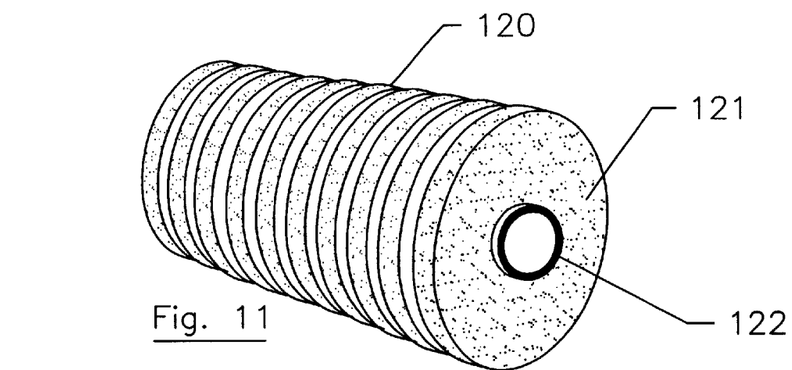
FIG. 11 shows an alternate sponge for the device.
Figure 12:
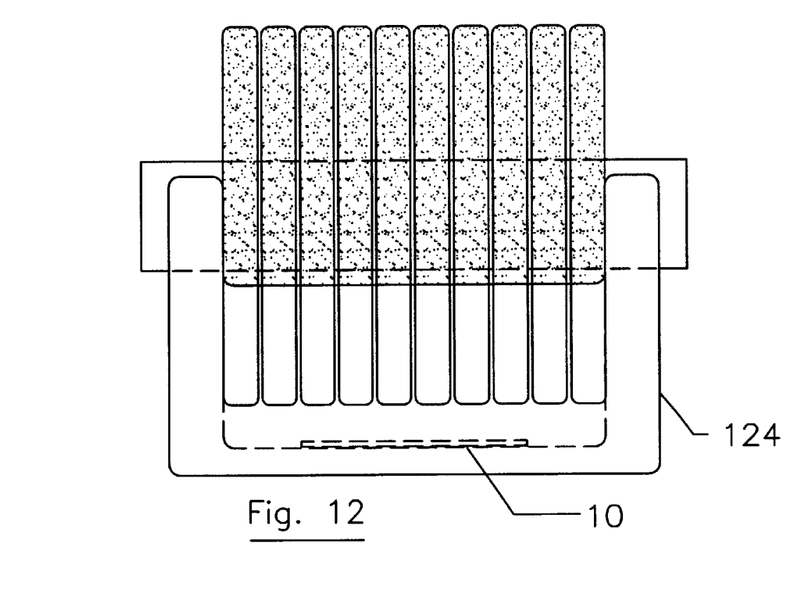
FIG. 12 is a side view of an alternate conformation of the device of the present invention.
Figure 13:
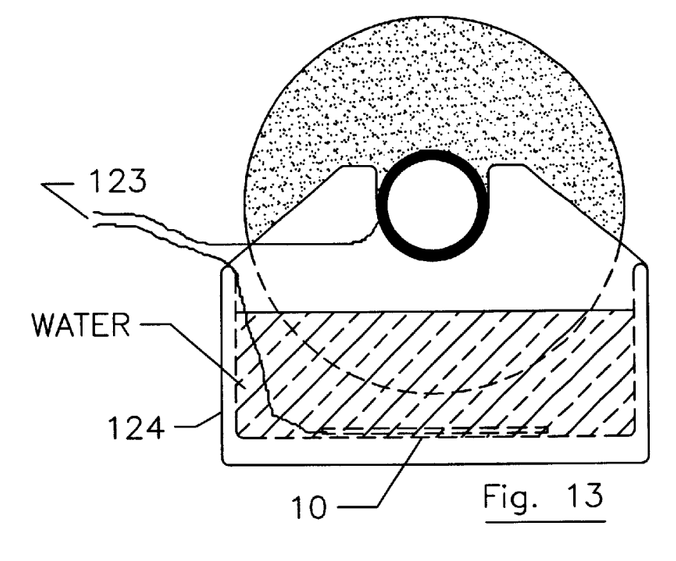
FIG. 13 is an end view of an alternate conformation.

(III) Operator grounding integrity verification circuit: Referring now to FIGS. 2, 5 and 10, the device with circuitry 34 added allows the operator to verify whether his electrostatic protective devices such as wrist straps and/or conductive footwear are functioning properly. The electrostatic charge grounding devices are in contact with ground 18. The operator completes the circuit by touching a third sensor plate 103. If the operator's electrostatic charge grounding devices are functioning properly, a fourth LED 204 on the control box 16 lights, confirming the integrity of the circuit. If the grounding of the operator is impaired such as to allow an unacceptably high level of electrostatic charge to be built up on the operator's body, a fifth LED 205 on the control box is activated, and the audible alarm 26 is sounded.

Figure 6:
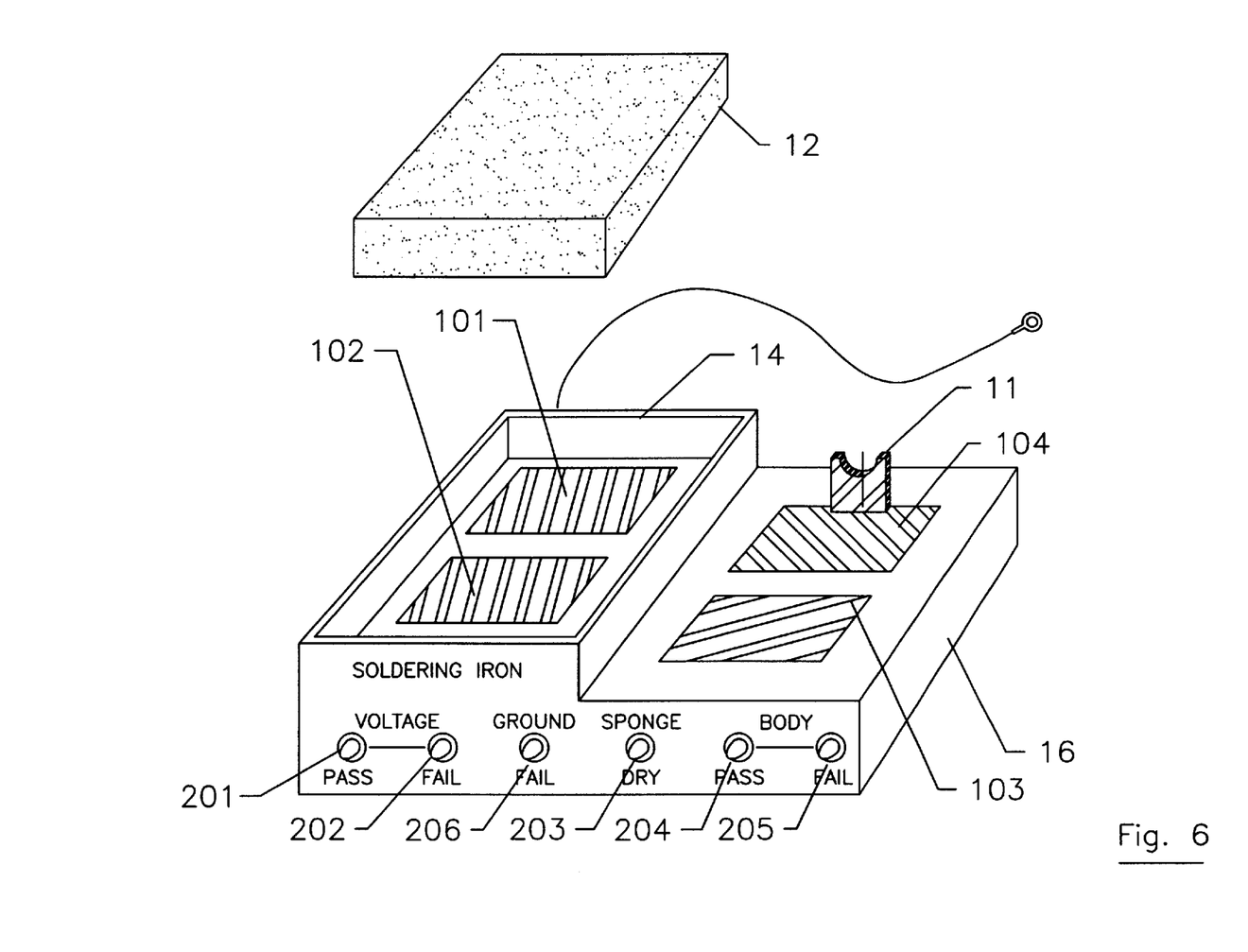
FIG. 6 is a perspective view of another alternate conformation of the stand-alone embodiment of the present invention.

(IV) Hard ground verification circuit: Referring now to FIGS. 2 and 6, a fourth sensor plate 104 electrically connected to the conductive soldering iron cradle 11 and its accompanying circuitry are added to control box 16. This arrangement of the device allows for measuring whether the tip or the heating barrel of the soldering iron resting in the cradle 11 is indeed grounded hard. That is, the device determines, when the soldering iron's tip or barrel is touched to the ground test plate 104, whether or not a very low resistance, 5 ohms or less, or a level as may be required by relevant safety agencies, is measured. If the resistance to ground exceeds the chosen level, LED 206 on control box 16 is activated.

Figure 3:
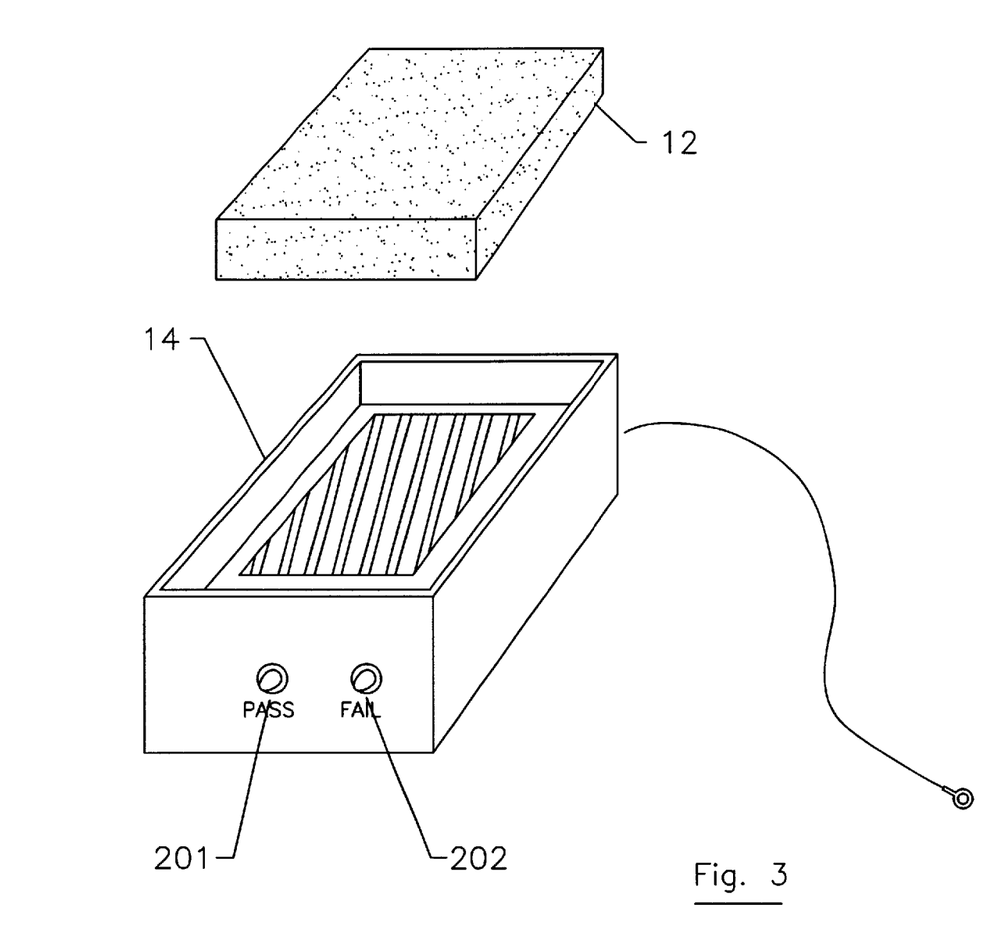
FIG. 3 is a perspective view, partially exploded, of a stand-alone embodiment of the present invention.

FIG. 1 illustrates the components of the device designed to be added to an existing soldering station. Some of the potential arrangements of the present invention built as a stand-alone device are illustrated in FIGS. 3–6. In FIG. 3, the device is built with only the soldering iron tip voltage test circuit, and uses at least a part of the control box as the sensor plate. The control box can be made entirely from a suitable metal so that it functions as the sensor plate. FIG. 4 shows the device with the dry sponge sensing circuit added, FIG. 5 includes the operator grounding integrity test circuit, and FIG. 6 shows the implementation that includes the soldering iron hard ground integrity test.

Figure 7:
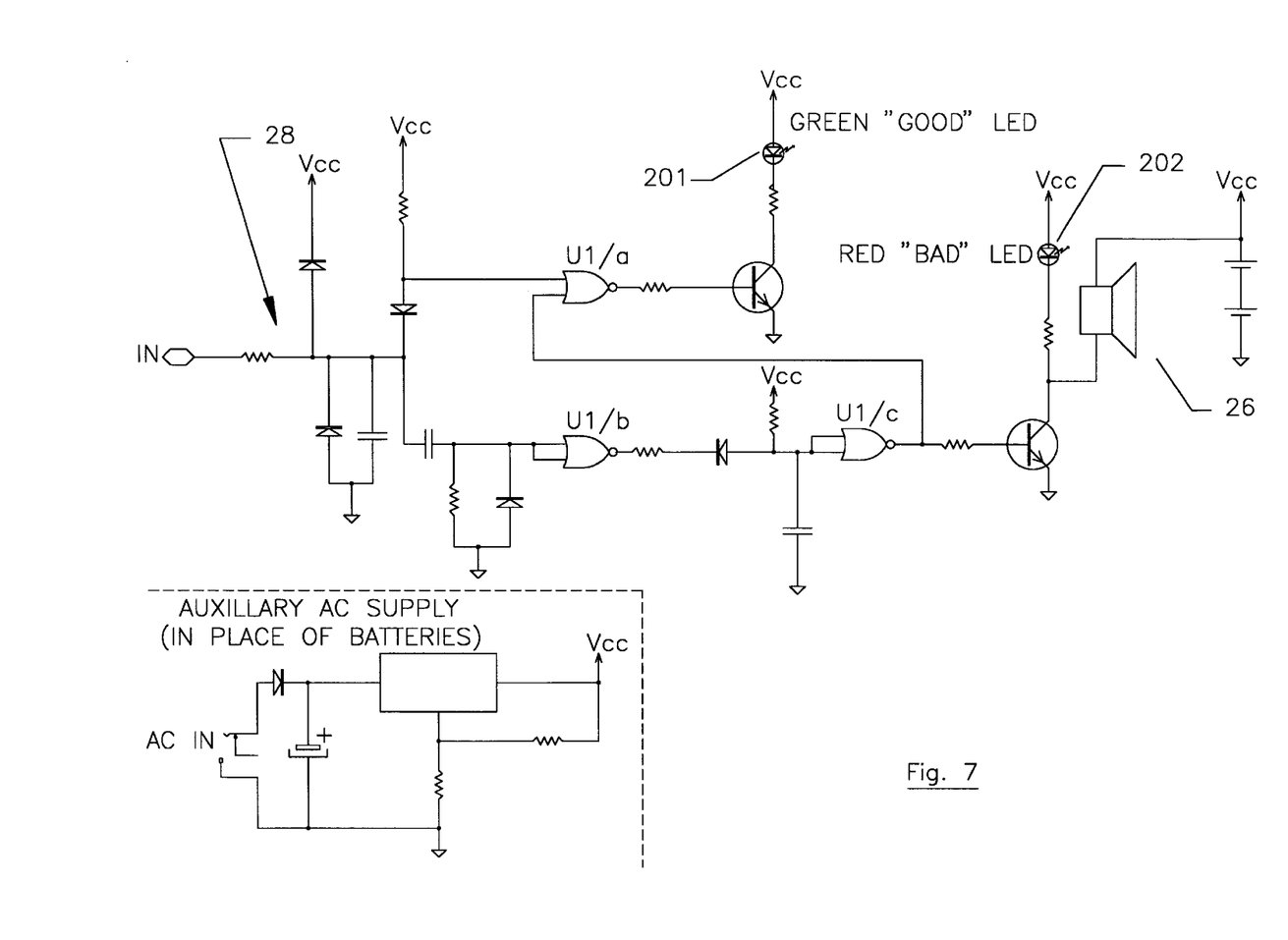
FIG. 7 is the circuit diagram for the soldering iron tip voltage test circuit of the present invention.

FIG. 7 shows a circuit diagram for the soldering iron tip voltage test circuit 28. Sensor plate 101 is connected to input J1/2 IN of the circuit, and the ground connection to the facility safety ground 18 goes to the J1/1 GROUND input.

When the circuit is at rest, i.e. when there is nothing touching the sponge 12, capacitor C1 will charge up to $V_{cc}$ minus one voltage drop, the charging path comprising R2 and D1. A logic high will thus exist on input pin 2 of NOR gate U1/a, causing the output of NOR gate U1/a to be at logic 0 independent of the logic level which exists on input pin 1 of U1/a. Buffer transistor Q1 will be cut-off, and green LED 201 (L1) will be off. Further, when the circuit is at rest, the chain comprising U1/b and U1/c will be at rest. The output pin 10 of NOR gate U1/c will be at a logic low, hence buffer transistor Q2 will be off, as will red LED 102 (L2) and audible alarm 26 (SP1).

When a properly grounded soldering iron tip touches the sponge 12, capacitor C1 discharges through a resistive path which comprises R5, the resistance of the cleaning sponge, and the grounded soldering iron 22. The voltage on pin 2 of U1/a falls below the logic low threshold level, and its output pin 3 will go high. LED 201 (L1) comes on, and stays on until the soldering iron tip is removed and the voltage across C1 will have risen above the threshold level.

If an improperly grounded soldering iron tip touches the sponge 12, the impedance to ground which it represents, and which is connected to J1/2 IN will be very high (possibly hundreds of megohms) so as to not sufficiently affect the charge on C1 to cause U1/a to change state. However, parasitic capacitance between the heating element of the soldering iron and the isolated metal parts of the soldering iron will cause a fraction of the AC voltage typically applied to the heating element to be coupled to the metal parts. This parasitic voltage enters J1/2 IN via the sponge 12 and will be processed through the U1/b, U1/c chain as follows.

The AC voltage enters the chain through R5, and the negative alternances are clipped to one diode voltage drop below the ground level by D2, and truncated to one diode voltage drop above $V_{cc}$ by D3. The remaining mostly positive pulses then go via C2 to inputs 5 and 6 of NOR gate U1/b which acts as a pulse shaper/inverter. Additional input protection and filtering is provided by R4 and D4.

Capacitor C3 which, at rest, is charged to $V_{cc}$ through R6, will discharge through R7 and D5 as soon as output 4 of U1/b goes low. This only happens when parasitic voltage of sufficient amplitude enters J1/2 IN. When the voltage across C3 is low, output pin 10 of U1/c will be high, and remain so until the improperly grounded soldering iron 22 is removed from the sponge 12 and capacitor C3 has gained enough charge to cause U1/c to switch. With pin 10 of U1/c being high, buffer transistor Q2 will be on, as will red LED 202 (L2), and the audible alarm 26 (SP1).

Figure 8:
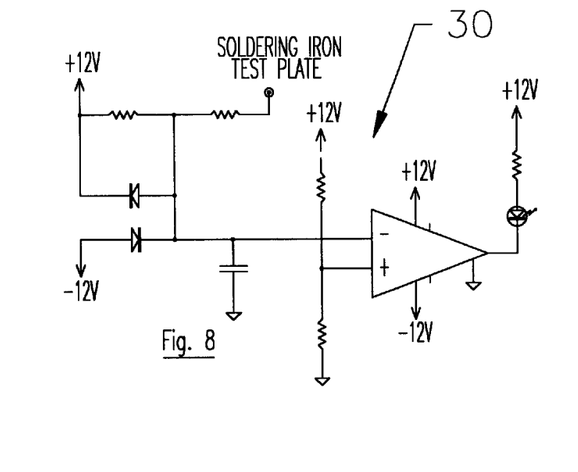
FIG. 8 shows the additional circuitry required to implement the soldering iron ground integrity verification function of the present invention.

FIG. 8 shows the additional circuitry required to implement the soldering iron hard ground integrity function circuit 30.

FIG. 9 shows the additional circuitry required to implement the dry sponge sensing circuit 32.

FIG. 10 illustrates the additional circuitry required to implement the operator grounding integrity verification circuit 34.

An alternate conformation for the device is illustrated in FIGS. 11–14. In this conformation, sponge 120 includes a plurality of slices 121 that are mounted on a metal tube 122. The metal tube 122 serves as the sensing element. The metal tube 122 is connected to a wire 123 that connects the sponge 120 to the controlling circuitry. To implement the dry sponge sensing function, a sensor element 10 is placed in the water reservoir 125 of the sponge holder 124.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

We claim:

1. A grounding circuit monitoring device comprising:
   at least a first sensor means,
   a soldering iron with a grounding wire in an electrical cord in ohmic connection to a safety ground,
   a control box containing circuitry to operate said monitoring device, and
   a power source for said monitoring device; wherein
      a first test circuit is closed when a tip of the soldering iron is brought into ohmic contact with said first sensor means, such that when a grounding mechanism for the soldering iron is functioning properly, a first indicator means is activated, and when the soldering iron is not properly grounded, a second indicator means is activated; and wherein
      a second test circuit is closed when a cleaning device has a moisture level above a predetermined level, said cleaning device forming an ohmic contact between said first sensor means and a second sensor means, and when said cleaning device does not contain moisture above said predetermined level, said ohmic contact is broken so that said second test circuit is open and a third indicator means is activated.

2. A grounding circuit monitoring device comprising:
   at least a first sensor means,
   a soldering iron with a grounding wire in an electrical cord in ohmic connection to a safety ground,
   a control box containing circuitry to operate said monitoring device, and
   a power source for said monitoring device; wherein
      a first test circuit is closed when a tip of the soldering iron is brought into ohmic contact with said first sensor means, such that when a grounding mechanism for the soldering iron is functioning properly, a first indicator means is activated, and when the soldering iron is not properly grounded, a second indicator means is activated; and wherein
      a second test circuit is closed when a second sensor means is touched by an operator such that when electrostatic charge grounding devices attached to the operator are functioning properly, a third indicator means is activated, and when electrostatic grounding devices attached to the operator are not functioning properly and are thus allowing a dangerously high level of electrostatic charge, a fourth indicator means is activated.

3. The monitoring device of claim 2 wherein:
   said fourth indicator means includes an audible alarm.

4. A grounding circuit monitoring device comprising:
   at least two sensor means,
   a cleaning device,
   a control box containing circuitry to operate said monitoring device, and
   a power source for said monitoring device; wherein
      said monitoring device is in ohmic connection to a safety ground point, and
      a first test circuit is closed when said cleaning device has a moisture level above a predetermined level, said cleaning device thereby forming an ohmic contact between said at least two sensor means, and when said cleaning device does not contain moisture above said predetermined level, said ohmic contact is broken so that said first test circuit is open and a first indicator means is activated.

5. The monitoring device of claim 4 wherein:
   a second test circuit is closed when a tip of a soldering iron is brought into ohmic contact with a first one of said sensor means, such that when a grounding mechanism for the soldering iron is functioning properly, a second indicator means is activated, and when the soldering iron is not properly grounded, a third indicator means is activated.

6. The monitoring device of claim 5 wherein:
   said third indicator means includes an audible alarm.

7. The monitoring device of claim 5 wherein:
   a third test circuit is closed when the tip of the soldering iron is brought into ohmic contact with a third sensor means, such that when resistance of a soldering iron low impedance path is below a predetermined level, a fourth indicator means is activated.

8. The monitoring device of claim 4 wherein:
   a second test circuit is closed when a third sensor means is touched by an operator such that when electrostatic charge grounding devices attached to the operator are functioning properly, a second indicator means is activated, and if the operator has accumulated a dangerously high level of electrostatic charge, a third indicator means is activated.

9. The monitoring device of claim 8 wherein:
said third indicator means includes an audible alarm.

10. A grounding circuit monitoring device comprising:
at least a first sensor means,
an operator with electrostatic charge grounding devices attached to the operator,
a control box containing circuitry to operate said monitoring device, and
a power source for said monitoring device; wherein
said monitoring device is in ohmic connection to a safety ground point, and
a first test circuit is closed when said first sensor means is touched by an operator such that when the electrostatic charge grounding devices attached to the operator are functioning properly, a first indicator means is activated, and when electrostatic grounding devices attached to the operator are not functioning properly and are thus allowing a dangerously high level of electrostatic charge, a second indicator means is activated; and wherein
a second test circuit is closed when a cleaning device has a moisture level above a predetermined level, said cleaning device forming an ohmic contact between said first sensor means and a second sensor means, and when said cleaning device does not contain moisture above said predetermined level, said ohmic contact is broken so that said second test circuit is open and a third indicator means is activated.

11. A grounding circuit monitoring device comprising:
at least a first sensor means,
a soldering iron,
a cleaning device,
an operator with electrostatic charge grounding devices attached to the operator,
a control box containing circuitry to operate said monitoring device, and
a power source for said monitoring device; wherein
said monitoring device is in ohmic connection to a safety ground point via a grounding wire of an electrical cord of the soldering iron, and
a first test circuit is closed when a tip of the soldering iron is brought into ohmic contact with said first sensor means, such that when a grounding mechanism for the soldering iron is functioning properly, a first indicator means is activated, and when the soldering iron is not properly grounded, a second indicator means is activated, and
a second test circuit is closed when the tip of the soldering iron is brought into ohmic contact with a second sensor means, such that when resistance of a soldering iron low impedance path is below a predetermined level, a third indicator means is activated, and
a third test circuit is closed when said cleaning device has a moisture level above a predetermined level, said cleaning device forming an ohmic contact between said first sensor means and a third sensor means, and when said cleaning device does not contain moisture above said predetermined level, said ohmic contact is broken so that said third test circuit is open and a fourth indicator means is activated, and
a fourth test circuit is closed when a fourth sensor means is touched by said operator such that when electrostatic charge grounding devices attached to the operator are functioning properly, a fifth indicator means is activated, and if the operator has accumulated a dangerously high level of electrostatic charge, a sixth indicator means is activated.

12. The monitoring device of claim 11 wherein:
said second indicator means and said sixth indicator means include an audible alarm.

13. A circuit for a grounding circuit monitoring device comprising:
at least one input connected to a sensing means,
at least one connection to a safety ground, and
at least one output to a signalling mechanism; wherein
when said circuit has no input to said sensor means, a first capacitor is charged to a ground voltage level minus one voltage drop, said first capacitor is connected to a first input pin of a first NOR gate such that a logic high exists on said first input pin of said first NOR gate, thereby causing an output of said first NOR gate to be at logic 0 independent of a logic level on a second input pin of said first NOR gate, a buffer transistor connected to said output of said first NOR gate will be cut-off, and a first indicator means connected to said first buffer transistor will be off, and a second NOR gate and a third NOR gate connected to said first capacitor will similarly have outputs at logic 0, thereby causing a second buffer transistor connected to said second and third NOR gates to be cut off such that a second indicator means is off; and wherein
when a properly grounded soldering iron tip contacts said first sensor means, said first capacitor discharges, thereby causing a voltage at said first input pin of said first NOR gate to fall below a logic low threshold level, thus forcing said output of said first NOR gate to go to logic 1, thereby activating said first indicator means, and
when an improperly grounded soldering iron tip contacts said first sensor means, an impedance to ground placed on said input is sufficiently high so as to not affect the charge on said first capacitor so that said first NOR gate does not change state, and parasitic capacitance between a heating element of the soldering iron and isolated metal parts of the soldering iron causes a parasitic voltage comprising a fraction of an AC voltage applied to the heating element of the soldering iron to be coupled to the metal parts of the soldering iron, said parasitic voltage enters the circuit through the input and is clipped to one diode voltage drop from said ground voltage level by diodes connected to said input, said clipped voltage signal is transmitted via a second capacitor to said second NOR gate, and when said clipped voltage signal has an amplitude above a predetermined level, an output of said second NOR gate goes low, thereby causing a third capacitor connected to said output of said second NOR gate and to an input of said third NOR gate to discharge so that an output of said third NOR gate goes high so as to turn said second buffer transistor on, thereby activating said second indicator means.

14. The circuit of claim 13 wherein:
said circuit further includes an additional test circuit, said additional test circuit comprising means to positively bias an input signal, said biased input signal is then clipped to one voltage drop from a ground level, a resultant signal is then processed through a comparator, and when said resultant signal exceeds a predetermined level, said comparator activates a third indicator means.

15. The circuit of claim 14 wherein:

a buffer op amp is used to amplify said resultant signal before said resultant signal is processed by said comparator.

16. The circuit of claim 15 wherein:

said circuit includes at least one signal filtering means.

17. The circuit of claim 14 wherein:

said circuit includes at least one signal filtering means.

18. The circuit of claim 13 wherein:

said circuit includes at least one signal filtering means.

* * * * *